United States Patent
Eum et al.

(10) Patent No.: US 6,265,672 B1
(45) Date of Patent: Jul. 24, 2001

(54) MULTIPLE LAYER MODULE STRUCTURE FOR PRINTED CIRCUIT BOARD

(75) Inventors: Jae Suk Eum; Young Han Kim, both of Chungchongbuk-do (KR)

(73) Assignee: Simm Tech Co. Ltd. (KR)

( * ) Notice: Subject to any disclaimer, the term of this patent is extended or adjusted under 35 U.S.C. 154(b) by 0 days.

(21) Appl. No.: 09/274,290

(22) Filed: Mar. 22, 1999

(30) Foreign Application Priority Data

Dec. 31, 1998 (KR) .................................................. 98-63449

(51) Int. Cl.$^7$ .............................. H05K 1/03; H05K 1/16; H05K 7/02
(52) U.S. Cl. ..................... 174/255; 174/260; 361/760; 361/780; 361/795
(58) Field of Search ................ 174/255, 36, 260; 361/768, 780, 783, 795, 760

(56) References Cited

U.S. PATENT DOCUMENTS

| | | | |
|---|---|---|---|
| 5,574,630 | * 11/1996 | Kresge et al. | 361/792 |
| 5,640,048 | * 6/1997 | Selna | 257/738 |
| 5,714,718 | * 2/1998 | Tanaka | 174/255 |
| 5,719,750 | * 2/1998 | Iwane | 361/794 |
| 5,726,863 | * 3/1998 | Nakayama et al. | 361/794 |
| 5,847,936 | * 12/1998 | Forehand et al. | 361/794 |
| 5,912,809 | * 6/1999 | Steigerwald et al. | 361/780 |
| 5,926,377 | * 7/1999 | Nakao et al. | 361/763 |
| 6,084,779 | * 7/2000 | Fang | 361/763 |

* cited by examiner

Primary Examiner—Albert W. Paladini
Assistant Examiner—I B Patel
(74) Attorney, Agent, or Firm—Nathan N. Kallman

(57) ABSTRACT

A printed circuit board having multiple layers, includes: a copper film for removing signal interference and noise and matching impedance, formed between pads of a lowermost layer which are connected to of an uppermost layer.

5 Claims, 3 Drawing Sheets

MULTIPLE LAYER MODULE STRUCTURE FOR PRINTED CIRCUIT BOARD

BACKGROUND OF THE INVENTION

The present invention is related to a printed circuit board (PCB), and more particularly to a multiple layer module structure taking into account impedance, noise and signal interference.

In general, a multi-layer module for PCB in a direct Rambles Rim module which includes eight layers and is designed by taking into account impedance, noise and signal interference. For example, as shown in FIG. 1, a PCB multiple layer module 1 for a PCB including eight layers comprises a first layer 11 formed as an uppermost layer and which components are disposed therein, a second layer 12 for matching the impedance of the first layer 11 and protecting signals from the noise and interference, a third layer 13 for receiving and outputting signals which is disposed under the second layer 12, a fourth layer 14 which the power Vdd is supplied thereto and is disposed under the third layer 13 as a power layer, a fifth layer 15 which is disposed under the fourth layer 14 as a ground layer, a sixth layer 16 for receiving and outputting signals which is disposed under the fifth layer 15, a seventh layer 17 which is disposed under the sixth layer 16 as a ground layer and an eighth layer 18 which is disposed under the seventh layer 17.

In the prior 8-layer module 1, the second layer 12 is formed as a ground layer under the first layer 11 so as to prevent the noise and signal interface between components disposed in the first layer 11. The second layer 12 which is a ground layer and the fourth layer 14 which is a power layer, are disposed above and below the third layer 13 which receives and outputs the signals. The fifth layer 15 and the seventh layer 17 which are ground layers, are disposed above and below the sixth layer 16 which receives and outputs signals. The eighth layer 18 which is a lowermost layer, is disposed below the seventh layer 17 which is a ground layer.

That is, the layers disposed above and below the layer where components are disposed or the signals are received and outputted, are wrapped in copper so as to prevent interference and match the impedance therebetween. In other words, so as to prevent the signal interference and the noise of the layers, it made the second layer 12 as a ground layer wrapped in copper. The second layer 12 as a ground layer and the fourth layer 14 as a power layer which are disposed below and above the third layer 13 respectively, are wrapped in copper and the fifth layer 15 and the seventh layer 17 which are disposed respectively as a ground layer below and above the sixth layer 16, are wrapped in copper. In the eighth layer 18, only the signal lines are wrapped in copper.

However, the prior multiple layer module has a disadvantage that it is constituted in eight layers so that the fabrication process is complicated and the yield is degraded.

SUMMARY OF THE INVENTION

It is an object of the present invention to provide a PCB of multiple layer module structure having six layers which increases the yield due to the process reduction.

According to an aspect of the present invention, there is provided a printed circuit board having multiple layer module structure, comprising: a copper film for removing signal interference and noise and matching impedance, being formed between pads of a lowermost layer which are connected to solder balls of an uppermost layer and in a patterned portion of the lowermost layer which corresponds to patterns formed in a layer just above the lowermost layer.

According to another aspect of the present invention, there is provided a printed circuit board having a multiple layer module structure, comprising: a first layer which components are disposed therein; a second layer for removing signal interference and noise of the first layer and for matching impedance of the first layer, the second layer being disposed under the first layer as a ground layer; a third layer being disposed under the second layer as a signal layer; a fourth layer for matching impedance of the third layer, the fourth layer being disposed under the third layer as a power layer; a fifth layer being disposed under the fourth layer as a signal layer; and a sixth layer for removing signal interference and noise and for matching impedance of the fifth layer, on which a copper film is formed in the patterned portion thereof corresponding to patterns of the fifth layer and between pads connected to solder balls of the first layer.

Hereinafter, a preferred embodiment of the present invention will be described with reference to the attached drawings.

BRIEF DESCRIPTION OF THE DRAWINGS

Further objects and advantages of the present invention will be apparent from then following description, reference being made to the accompanying drawings wherein preferred embodiments of the present invention are clearly shown.

In the drawings.

DETAILED DESCRIPTION OF THE PREFERRED EMBODIMENTS

Figure 1:
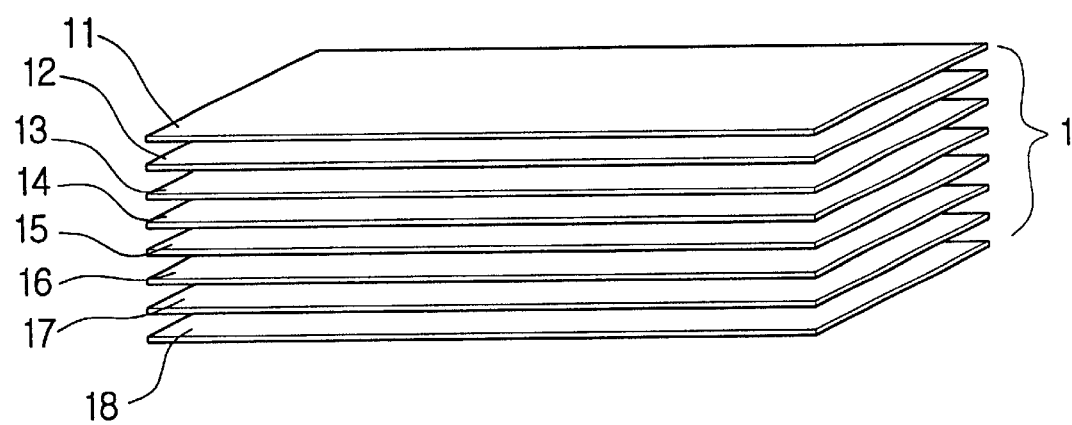
FIG. 1 is a view showing the structure of a prior PCB having an eight-layer module.
Figure 2:
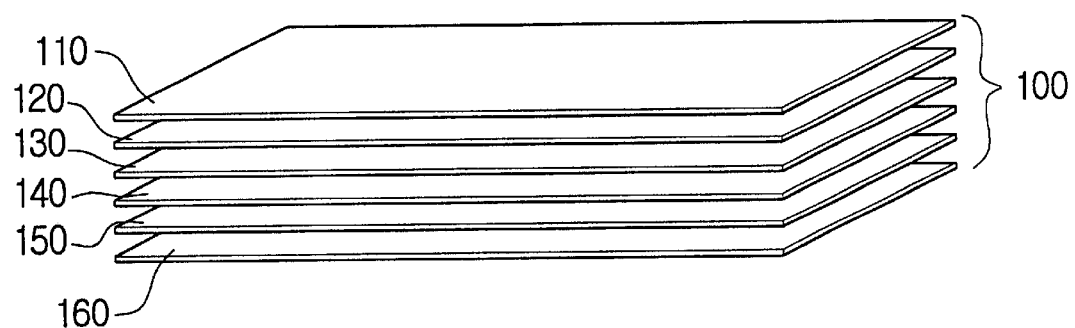
FIG. 2 is a view showing the structure of a PCB having six-layer module in accordance with an embodiment of the present invention.

Referring to FIG. 2, a PCB having a multiple layer module structure, includes six layers 110, 120, 130, 140, 150 and 160. To remove signal interference and noise and to match impedance, a copper film is formed between pads 161 of a sixth layer 160 which is a lowermost layer, which are connected to solder balls of a first layer 110 which is an uppermost layer and in a portion of the sixth layer 160 which corresponds to patterns formed in a fifth layer 150 formed just above the sixth layer 160.

The structure of the multiple layer module in the PCB of the present invention will be described in more detail as follows.

Figure 4:
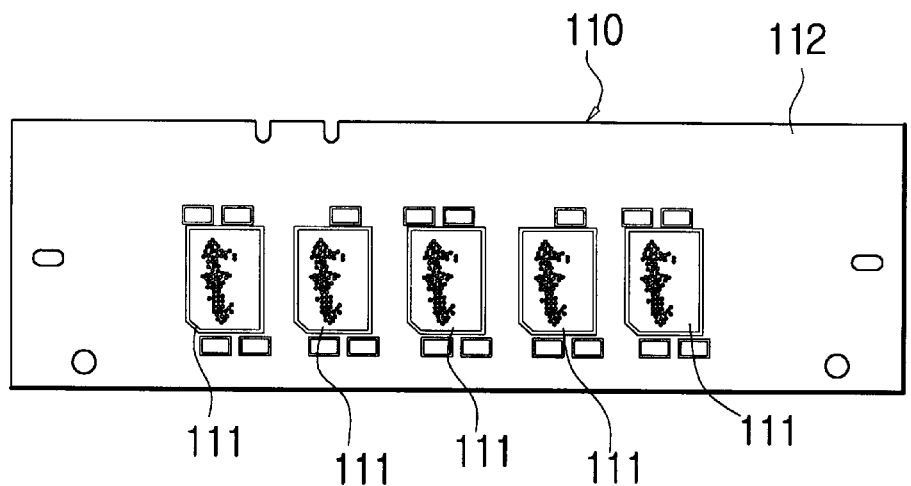
FIG. 4 is a view showing the structure of a first layer of the PCB in the present invention.

The first layer 110 as shown in FIG. 4, is an uppermost layer in which a plurality of components 111 are disposed. So as to separate the components to prevent the signal interference and noise between components, a copper film 112 for a ground power is formed on the portion of the first layer except pads. The second layer 120 is disposed under the first layer 110 as a ground layer so as to remove the signal interference and noise of the first layer and to match the impedance of the first layer.

The third layer 130 is formed under the second layer 120 as a signal layer. The fourth layer 140 is formed under the third layer 130 as a power Vdd layer so as to match the impedance of the third layer 130. The fifth layer 150 is formed under the fourth layer 140 as a signal layer. As shown in FIG. 3a, pads 151 and patterns 152 are formed on the fifth layer 150 on the sixth layer 160, copper 163 is formed in the portion corresponding to patterns of the fifth layer 150 and between pads 161 connected to solder balls of the first layer 110 so as to remove the signal interference and noise and to match the impedance of the fifth layer 150.

Figure 5:
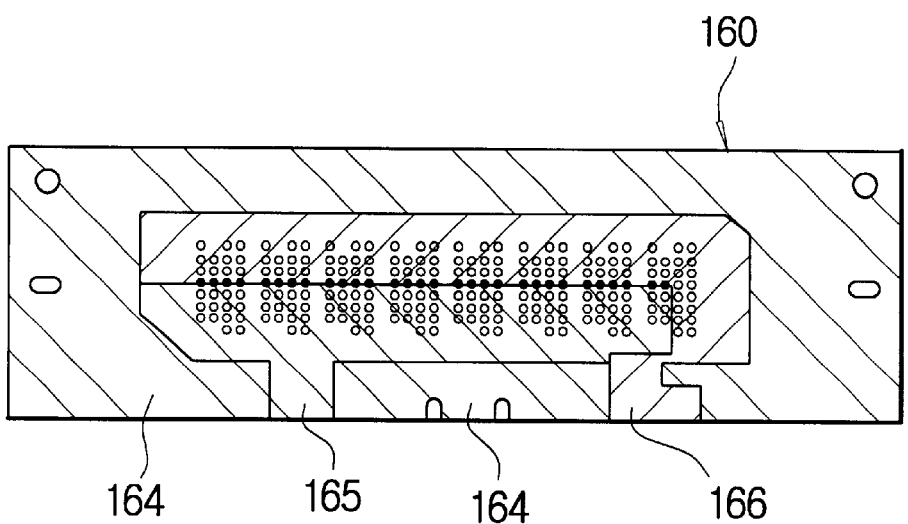
FIG. 5 is a view showing the structure of a sixth layer of the PCB in the present invention.

So as to remove the signal interference and noise and to match the impedance of the fifth layer 150, the sixth layer, as shown in FIG. 5, by using an epoxy according to the patterns of the fifth layer, is divided into a ground portion 164 in which a copper film for a ground voltage power is formed, a common portion 165 in which a copper film for a common voltage power is formed and a reference portion 166 for a reference voltage power in which a copper film is formed. A ground voltage, a common voltage and a reference voltage are applied to the ground portion 164, the common portion 165 and the reference portion 166, respectively.

The detailed operation of the multiple layer module in the PCB of the present invention will be described in more detail as follows. First, if a copper film 112 for a ground voltage power is formed in the portion of the first layer 110 excepts pads, as shown in FIG. 4, so as to separate the components 111 which are disposed in the first layer 110, the signal interference and noise are not generated between the components of the first layer 110.

That is, the ground power is applied to the copper film 112 which presents formed with the wall type and is made of a copper presents the components from interfering with each other, thereby separating the components.

The second layer 120 is formed as a ground layer to make an electromagnetic interference (EMI) treatment for removing the interference and noise caused by the signals generated from the components 111 of the first layer 110 and to match the impedance.

The third layer 130 is formed as a signal layer and the fourth layer 140 is formed as a Vdd power layer to make an EMI treatment for matching the impedance. The fifth layer 150 is formed as a signal layer and the sixth layer 160, as shown in FIG. 5, is formed as a Vdd power layer in which the copper film 163 is formed.

Therefore, the second layer 120 is formed between the first layer 110 and the third layer 130 as a ground layer to prevent the interference and noise between the first layer 110 and the third layer 130 from generating and matching the impedance. The fourth layer 140 is formed between the third layer 130 and the fifth layer 150 as a Vdd power layer to prevent the interference and noise between the third layer 130 and the fifth layer 150 and to match the impedance. The Vdd power layer is formed in the sixth layer to prevent the interference and noise and to match the impedance of the fifth layer 150.

The sixth layer 160 is divided into a ground portion 164 in which a copper film for a ground voltage power is formed, a common portion 165 in which a copper portion film for a common voltage power is formed and a reference portion 166 for a reference voltage power in which a copper film is formed by using an epoxy according to the patterns of the fifth layer 150 to form a copper film. The corresponding signals, for example, a ground voltage, a common voltage and a reference voltage are applied to the ground portion 164, the common portion 165 and the reference portion 166, respectively.

That is, the sixth layer is divided into three portions which are the ground portion 164, the common portion 165 and the reference portion 166 to which a ground voltage, common voltage and a reference voltage are applied, respectively, thereby removing the signal interference and noise and matching the impedance of the fifth layer 150.

Figure 3:
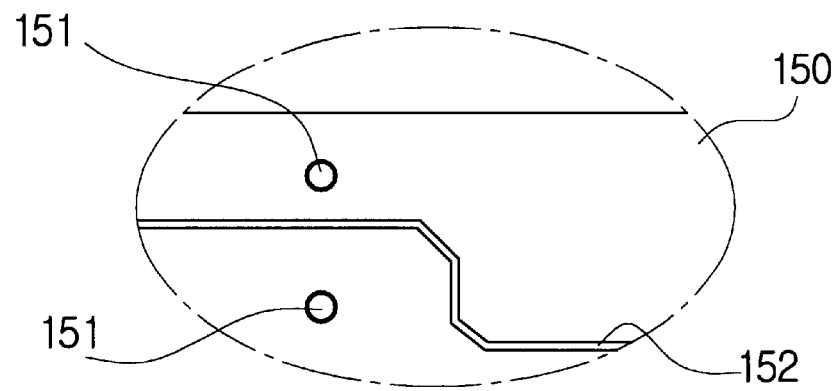
FIG. 3a is a view showing the structure of a fifth layer of the PCB in the present invention.
FIG. 3b is a view showing the structure of a sixth layer of the PCB in the present invention.
Figure 3:
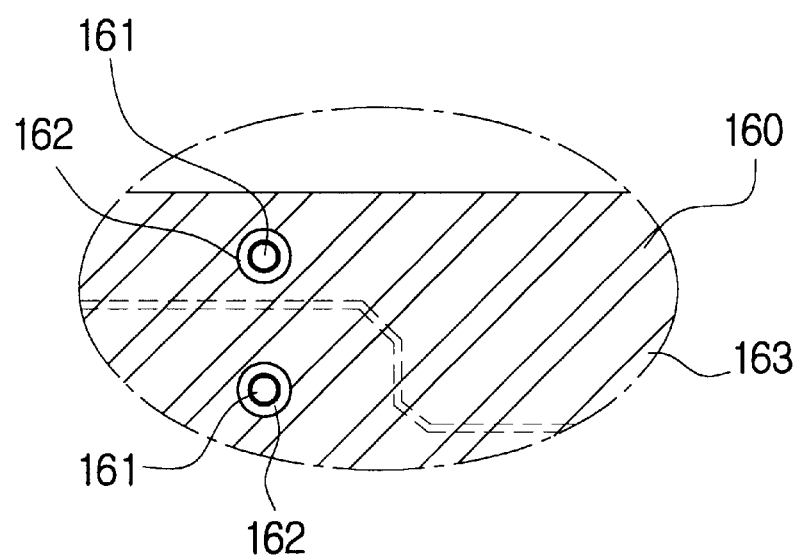

As shown in FIG. 3, the copper film 163 of the sixth layer 160 is formed in the portion of the sixth layer 160 which corresponds to the patterns of the fifth layer 150, and between pads 161 connected to solder balls of the first layer 110, and in the portion of the sixth layer 160 corresponding to patterns formed in the fifth layer 150. That is, the copper film 163 is formed on the sixth layer 160 except the epoxy portion 162 so as to prevent electrical shorting between pads 161.

The copper is filled in the portion of the sixth layer corresponding to the patterns of the fifth layer and between pads of the fifth layer 150 to prevent the signal interference and noise and to match the impedance of the fifth layer. That is, the PCB of the present invention divides the sixth layer 160 into three portions 164, 165 and 166 to which the corresponding voltage signals are respectively applied thereto and forms the copper film 163 is formed on the whole surface of the sixth layer 160 including the portion of the sixth layer corresponding to the patterns formed in the fifth layer 150 and between the pads, thereby removing the signal interference and noise of the fifth layer 150 and matching the impedance.

According to the present invention, the PCB forms a multiple layer module including six layers not eight layers so that the fabrication process can be simplified and the cost can be reduced and the yield can be improved.

Various changes and modifications can be made without departing from the spirit and the scope of the invention as defined by the following claims.

What is claimed is:

1. A printed circuit board having multiple layer module structure, comprising:
   a copper film for removing signal interference and noise and matching impedance, being formed between pads of a lowermost layer which are connected to an uppermost layer and in a patterned portion of the lowermost layer which corresponds to patterns formed on a layer formed just above the lowermost layer.

2. A printed circuit board having a multiple layer module structure, comprising:
   a first layer having components are disposed therein;
   a second layer for removing signal interference and noise of the first layer and for matching impedance of the first layer, the second layer being disposed under the first layer as a ground layer;
   a third layer being disposed under the second layer as a signal layer;
   a fourth layer for matching impedance of the third layer, the fourth layer being disposed under the third layer as a power layer;
   a fifth layer being disposed under the fourth layer as a signal layer; and
   a sixth layer for removing signal interference and noise and for matching impedance of the fifth layer, which a copper film is formed in the portion thereof corresponding to patterns of the fifth layer and between pads of the first layer.

3. The printed circuit board as claimed in claim 2, wherein in the first layer, a copper film for a ground voltage power is formed except at the pads, to separate the components to prevent the signal interference and noise of the components.

4. The printed circuit board as claimed in claim 2, wherein so as to remove the signal interference and noise and to match the impedance of the fifth layer, according to the patterns of the fifth layer, the sixth layer is divided into a ground portion in which a copper film for a ground voltage power is formed, a common portion in which a copper portion film for a common voltage power is formed and a reference voltage portion for a reference voltage power in which a copper film is formed and a ground voltage, wherein a common voltage and a reference voltage are applied to the ground portion, the common portion and the reference portion, respectively.

5. The printed circuit board as claimed in claim 4, wherein by using an epoxy, according to the patterns of the fifth layer, the sixth layer is divided into a ground portion in which a copper film for a ground voltage power is formed, a common portion in which a copper portion film for a common voltage power is formed therein and a reference portion for a reference voltage power in which a copper film is formed and a ground voltage, a common voltage and a reference voltage are applied to the ground portion, the common portion and the reference portion, respectively.

* * * * *